United States Patent
Ayodhya et al.

(10) Patent No.: US 10,848,425 B2
(45) Date of Patent: Nov. 24, 2020

(54) METHOD, SYSTEM AND PROGRAM PRODUCT FOR DATA TRANSMISSION WITH A REDUCED DATA VOLUME

(71) Applicant: Siemens Aktiengesellschaft, Munich (DE)

(72) Inventors: Kiran Ayodhya, Erlangen (DE); Rui Li, Shandong (CN)

(73) Assignee: Siemens Aktiengesellschaft, Munich (DE)

( * ) Notice: Subject to any disclaimer, the term of this patent is extended or adjusted under 35 U.S.C. 154(b) by 106 days.

(21) Appl. No.: 16/324,374

(22) PCT Filed: Aug. 9, 2017

(86) PCT No.: PCT/EP2017/070194
§ 371 (c)(1),
(2) Date: Feb. 8, 2019

(87) PCT Pub. No.: WO2018/029250
PCT Pub. Date: Feb. 15, 2018

(65) Prior Publication Data
US 2019/0173795 A1    Jun. 6, 2019

(30) Foreign Application Priority Data
Aug. 9, 2016 (EP) ...................... 16183437

(51) Int. Cl.
*H04L 12/801* (2013.01)
*H03M 7/30* (2006.01)
*G06F 16/174* (2019.01)

(52) U.S. Cl.
CPC .......... *H04L 47/12* (2013.01); *H03M 7/3059* (2013.01); *H03M 7/3082* (2013.01); *G06F 16/1744* (2019.01); *G06F 16/1748* (2019.01)

(58) Field of Classification Search
CPC ..... G06F 16/174–1756; H04L 41/0631; H04L 41/0654; H04L 43/062; H04L 47/12;
(Continued)

(56) References Cited

U.S. PATENT DOCUMENTS

2010/0114345 A1* 5/2010 Conejer Olesti ...... H04H 60/58
700/94

OTHER PUBLICATIONS

Zoltan Banko et al, PCA driven similarity for segmented univariate time series, Jan. 2009, Hungarian Journal of Industrial Chemistry, pp. 59-67 (Year: 2009).*

(Continued)

*Primary Examiner* — Michael Thier
*Assistant Examiner* — Prince A Mensah
(74) *Attorney, Agent, or Firm* — Cozen O'Connor

(57) ABSTRACT

A computer-implemented method for data transmission at reduced data volumes includes sampling a data stream in consecutive time intervals and generating consecutive data packages, calculating, via principal component analysis, projections of its data points onto a set of principal components, aligning, via dynamic time warping, the projected data points to respective projected data points of an earlier generated data package and calculating distances between the aligned data points, determining and comparing the maximum of the calculated distances to a threshold value, and transmitting the newly generated data package to a data sink and setting the newly generated data package as the earlier generated data package for the next aligning step if the maximum distance exceeds the threshold value or otherwise inhibiting the transmission and retaining the earlier generated data package for the next aligning step.

8 Claims, 3 Drawing Sheets

(58) Field of Classification Search
CPC .... H03M 7/30; H03M 7/3059; H03M 7/3062; H03M 7/3064
See application file for complete search history.

(56) References Cited

OTHER PUBLICATIONS

Ratanamahatana C.A., Keogh E. "Everything you know about dynamic time warping is wrong", Proc. 3rd Workshop on Mining Temporal and Sequential Data, in conjunction with 1th ACM SIGKDD International Conference on Knowledge Discovery and Data Mining (DKK-2004), Aug. 22-25, 2004; 2004.

Daniel Erwin Riedel et al: "Threshold Dynamic Time Warping for Spatial Activity Recogn IT Ion", pp. 1-14, XP055414841, Retrieved from the Internet: URL:http://citeseerx.ist.psu.edu/viewdoc/download?doi=10.1.1.83.4888&rep=repl&type=pdf [retrieved on Oct. 11, 2017] abstract paragraph [0002]—paragraph [0003]; 2004.

Banko Z. et al: "PCA Driven Similarity for Segmented Univariate Time Series", pp. 59-67, XP055325321, Retrieved from the Internet: URL:https://www.researchgate.net/profile/Janos_Abonyi/publication/228406362_PCA_driven_similarity_for_segmented_univariate_time_series/links/0046351b655fe8e6c1000000.pdf; 2009.

Brian Bushnell: "dedupe.sh output from BBTools", XP055325706, Retrieved from the Internet: URL: https://www.biostars.org/p/128593/ [retrieved on Dec. 2, 2016] p. 2; 2014.

\* cited by examiner

METHOD, SYSTEM AND PROGRAM PRODUCT FOR DATA TRANSMISSION WITH A REDUCED DATA VOLUME

CROSS-REFERENCE TO RELATED APPLICATIONS

This is a U.S. national stage of application No. PCT/EP2017/070194 filed Aug. 9, 2017. Priority is claimed on EP Application No. 16183437.9 filed Aug. 9, 2016, the content of which is incorporated herein by reference in its entirety.

BACKGROUND OF THE INVENTION

1. Field of the Invention

The invention relates to a method for data transmission with a reduced data volume, to a corresponding computer device or system for data transmission with a reduced data volume, and to a program product comprising code for directing a computer device or system to implement the method for data transmission with the reduced data volume.

2. Description of the Related Art

Systems that automatically collect and process very large volumes of data are increasingly used and implemented in the fields of, e.g., industry, energy, transportation and healthcare. Examples of such data may be measurement and/or system information of an automated factory or in any industrial control and factory automation, or medical records and/or image data in healthcare service. For diagnostic, error-detection and predictive-maintenance purposes or to be able to show compliance with internal policies and external regulations, it is often necessary to record such collected and/or processed data over a long time period, so that it can be retrieved and evaluated whenever required. For this purpose, the data to be recorded is event-triggered or periodically transmitted to a data storage, which may be a single device or may be spread across multiple storage devices, such as in a storage area network. The storage devices can be shared by multiple client computing devices, e.g., via a network, such as in a cloud storage implementation.

In the applications mentioned above, the volume of the data to be recorded is very large and may lead to high transmission and storage costs. One approach to reduce the costs is to perform data compression before the transmission. However, as the data is not only large in size but usually also very complex, the challenge is to design a data compression scheme that is easy to implement. Another approach could be to have a central data collector where the raw data is collected. This device would then perform data manipulation, such as averaging. The challenge here is that the quality of such manipulated data is very bad because it deviates largely from the actual raw data.

From Z. Banko et al.: "PCA Driven Similarity for Segmented Univariate Time Series", Hungarian Journal of Industrial Chemistry, 37 (2009) 59-67, it is known to measure the similarity of different time series of data collected in, e.g., chemical process industry. The originally multivariate time series are projected in single dimensions via principal component analysis (PCA). For each dimension, the univariate time series obtained are aligned via dynamic time warping (DTW), and the similarity of the time series is calculated from the distances between the aligned data points. To reduce the DTW computational effort, each univariate time series is approximated by a sequence of segments, each one represented by the mean value of its data points (piecewise aggregate approximation (PAA)) or a linear function (piecewise linear approximation (PLA)), and the DTW algorithm is applied to the representations.

SUMMARY OF THE INVENTION

It is an object of the invention to provide data transmission to a logging/data storage with a reduced data volume while ensuring high data transfer quality and largely reducing the costs.

This and other object and advantages are achieved in accordance with the invention by a computer-implemented method for data transmission with a reduced data volume, which method includes receiving a multivariate data stream including a plurality of data points, sampling the data stream in consecutive time intervals and generating consecutive data packages which each contain data points sampled in a window of a predetermined number of said consecutive sampling time intervals, calculating, via principal component analysis, for each data package projections of its data points onto a set of principal components, aligning, via dynamic time warping, for each newly generated data package and for each principal component the projected data points to respective projected data points of an earlier generated data package and calculating distances between the aligned data points, determining the maximum of the calculated distances and comparing the maximum to a threshold value, and transmitting the newly generated data package to a data sink and setting the newly generated data package as the earlier generated data package for the next aligning step if the maximum distance exceeds the threshold value or otherwise inhibiting the transmission and retaining the earlier generated data package for the next aligning step.

Rather than data manipulation or data compression, the method in accordance with the invention generates and selects packages of data to be transmitted based on some data change in each current (new) data package as compared to an earlier (old) data package. If a non-negligible or substantial change in the data is detected, the current data package is transmitted for storing in, e.g., a cloud because it reveals new information. Otherwise, i.e., if no or only a negligible change is detected, the data package will not be transmitted. In this way, the total volume of transmitted data is significantly reduced without changing the data and thus compromising the data quality.

The change detection method is statistically based, discovering the data change that is contained in multivariate data. First, the multivariate data is investigated by principal component analysis (PCA), and the variance in the data is captured by a given number of k principal components, preferably the k top principal components (i.e., eigenvectors with the largest eigenvalues). Subsequently, dynamic time warping (DTW) is applied to compare the principal components between new data and old data in order to detect a data change. Dynamic time warping is a well-known technique for determining the similarity between two temporal sequences of data by warping and aligning the sequences and then measuring a distance-like quantity between them.

The earlier (old) data package used for the comparison with the current (new) data package is retained and used until a data change is detected. Once a data change has been detected, the current (new) data package replaces the earlier (old) one and is be used for subsequent comparisons.

The maximum distance used for the comparison with the threshold value may be the largest one of individual maximum distances calculated for each principal component or a cumulative value of these individual maximum distances. The individual maximum distances, in turn, are determined from the distances (individual or accumulated, weighted or direct) between the aligned data points.

The threshold value can be preferably adapted to historical maximum distances to make it more robust to outliers. For example, the threshold value may be calculated from an average of the maximums determined for a predetermined number of the most recently data packages plus a margin percentage of, e.g., 5%.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

These and further embodiments will be apparent from the detailed description and examples that follow. For this, reference is made to the accompanying drawings, which show, by way of example, preferred embodiments of the present invention, and in which.

DETAILED DESCRIPTION OF THE EXEMPLARY EMBODIMENTS

Figure 1:
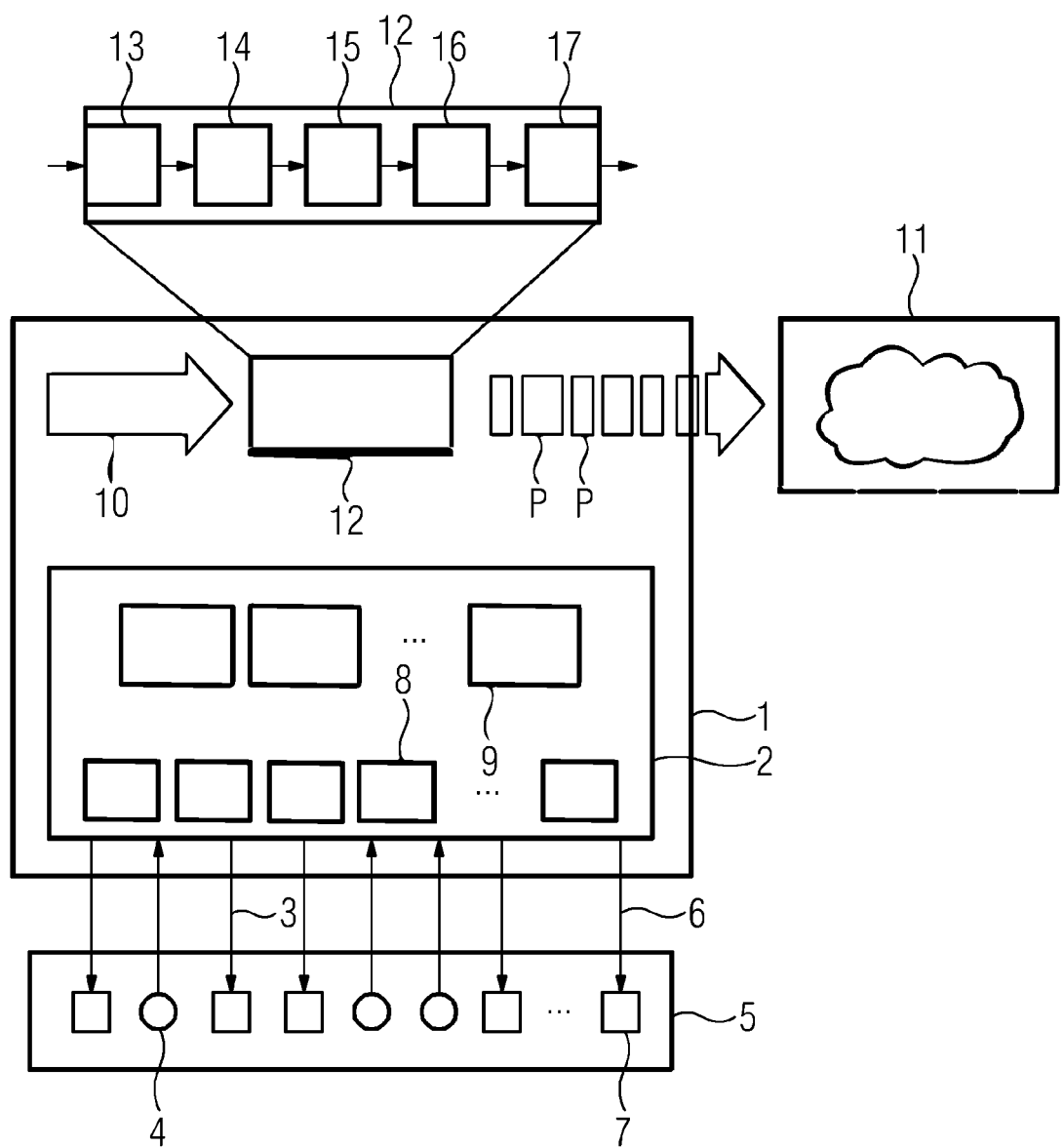
FIG. 1 illustrates an example of an industrial automation system which retrieves and collects data for transmitting to a data logging system in accordance with the invention.

FIG. 1 is a simplified block scheme illustrating an industrial automation system 1. A control system 2 receives measurement signals 3 from a sensor 4 in a system 5 under control, e.g., a technical process or system, and outputs actuating signals or control commands 6 to operating device 7 (e.g., actors) of the technical process 5. The control system 2 may be decentralized where distributed control components 8 contain and perform automation functions for different process areas, whereas central components 9 contain and perform operator control, monitoring, evaluation and other central coordination functions. One such central function is to automatically retrieve and collect very large amounts of data 10 for condition monitoring purposes in the broadest sense, which may cover, inter alia, fault diagnostic, predictive-maintenance, product quality, environmental performance, plant safety, plant performance and so on. The data 10 can be collected continuously or periodically so that a data stream is produced. The data 10 is usually multivariate and multidimensional (dependent and/or independent) and can include all technical and non-technical, raw and processed data which is gathered or generated by the automation system 1. The automation system 1 illustrated is only exemplary and representative of any other system that automatically collects huge volumes of data for recording.

The processing and analysis of the collected data 10 for the above-mentioned purposes and/or legal provisions for data retention require recording of the data 10 over a long time period. To this end, and in view of the huge data volume to be recorded, the data 10 is transmitted to an adequate data storage 11 outside the automation system 1, which may be a single device or, as shown, spread across multiple storage devices in a cloud storage network.

Furthermore, in order to reduce transmission and storage costs, the volume of the data 10 to be transmitted is reduced by a computing device or system 12 that may be part of the automation system 1 and, in particular, part of the central components 9.

The computing device or system 12 comprises a number of units 13, 14, 15, 16, 17, the functions of which are explained in detail below with reference to FIG. 2.

Figure 2:
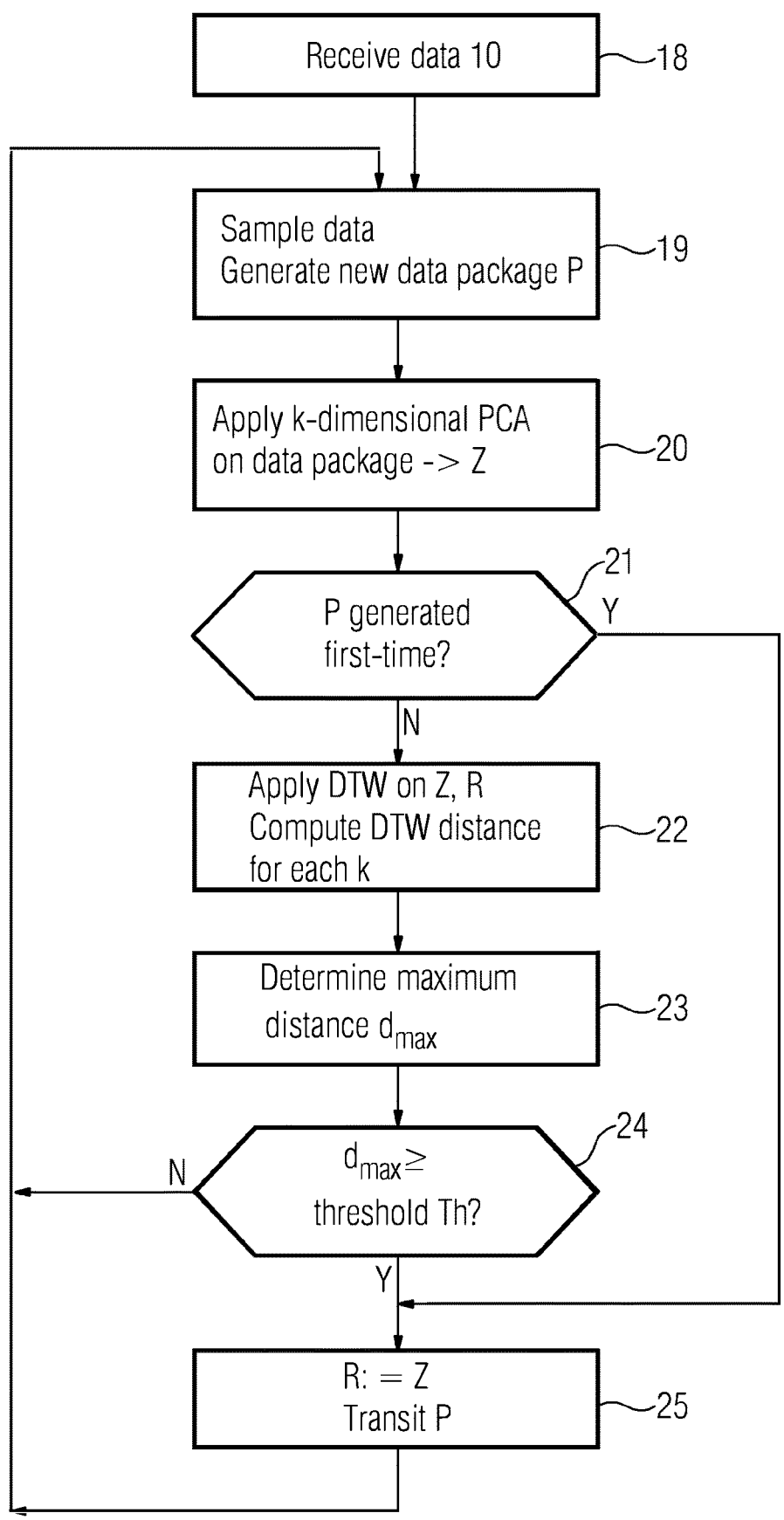
FIG. 2 is a flowchart depicting steps of an exemplary embodiment of a method for data transmission with a reduced data volume in accordance with the invention.

FIG. 2 is a flowchart exemplarily depicting steps of the method for reducing the volume of the data 10 to be transmitted without changing the data 10.

In a step 18, a receiving unit 13 receives the collected data 10 in the form of an incoming multivariate data stream of a plurality of data points. Assuming the data stream 10 is multivariate with n variables, it can be represented as a matrix:

$$\begin{matrix} V_{11} & \cdots & V_{1n} \\ \vdots & \ddots & \vdots \\ V_{1t} & \cdots & V_{tn} \end{matrix}$$

with the first sub-script denoting the time t and the second sub-script denoting the i-th variable. Hence, Vn represents the first variable at time 1. As the data arrive continuously, the matrix has its time dimension t infinite.

In a step 19, a sampling unit 14 samples the data stream in consecutive time intervals (time slots) and generates consecutive data packages P that each contain data points sampled in a predetermined number of the consecutive time intervals. Thus, the incoming data stream 10 is partitioned into a sequence of time windows w (see FIG. 3) of equal size, each consisting of a pre-selected number of sampling time intervals.

In a step 20, a calculating unit 15 calculates, via principal component analysis (PCA), for each newly generated data package P, projections of its data points onto a set of principal components. The projected data is hereinafter denoted as $Z=z_1, \ldots, z_k$. The orthogonality of the principal components ensures that the variance in the data 10 can be captured by a few components, where using the first k principal components with the largest eigenvalues will cover about 90% of data variance. An approximate value of k can be around 30. Hence, data reduction can be performed by projecting the data points on a couple of dimensions. In reality, the data 10 contains often missing values which, however, the PCA method can deal with.

In step 21, the projected data $Z=z_1, \ldots, z_k$ of the data package P generated for the first time is stored as a reference projection data $R=r_1, \ldots, r_k$.

In a step 22, the calculating unit 15 compares, for each of the k principal components, the projected data Z of the current (newly generated) data package P to the corresponding reference projection data R. To this end, the projected data Z and R are aligned via dynamic time warping (DTW). Each possible mapping of aligned projected data points $z_i$ and $r_j$ ($1 \leq i, j \leq k$) represents a warping path in an i×j matrix. With optimal alignment of Z and R, the cost function of the warping path is minimal, which cost function is the square of the distances $d(z_i,r_j)=(z_i-r_j)^2$ between the aligned data points $z_i, r_j$ is minimal. A dynamic programming approach is usually employed to evaluate the warping path. In addition, a window can be applied to calculate the distance of the data points following into it. Finally, a cumulative distance is represented as the distance between the two sequences (projected data Z and R). Therefore, similar sequences have smaller distance and vice versa.

For more information on DTW reference is had to Ratanamahatana C. A., Keogh E.: "Everything you know about dynamic time warping is wrong", Proc. 3rd Workshop on Mining Temporal and Sequential Data, in conjunction with 10th ACM SIGKDD International Conference on Knowledge Discovery and Data Mining (KDD-2004), Aug. 22-25, 2004.

In a step 23, a judging unit 16 determines whether there is a non-negligible or substantial change in the data of the current (new) data package P compared to the earlier (old) reference data package. To this end, the maximum distance $d_{max}$ among all the distances calculated for the k dimensions (principal components) is determined and, in a step 24, compared to a threshold value Th. The maximum distance $d_{max}$ is regarded as the overall distance between the projected data Z of the current data package and the reference projection data R. The maximum distance $d_{max}$ will be low or zero if these two sets of data are more or less identical, which means the data has remained unchanged. In this case, the maximum distance $d_{max}$ will remain below the threshold value Th and, as a consequence, the current data package P will not be transmitted to the data storage 11. This means that the transmitting unit 17 will be disabled from transmitting. Conversely, if the maximum distance $d_{max}$, exceeds the threshold value Th, a non-negligible or substantial change in the data is considered to be detected and the judging unit 16 enables in a step 25 the transmitting unit 17 to transmit the current data package P (sampled from the original data stream 10) to the data storage 11.

The threshold value Th can be preferably adapted to historical maximum distances to make it more robust to outliers. For example, the threshold value may be calculated from an average of the maximums determined for a predetermined number of the, e.g., 10 most recently data packages, plus a margin percentage of, e.g., 5%.

Figure 3:
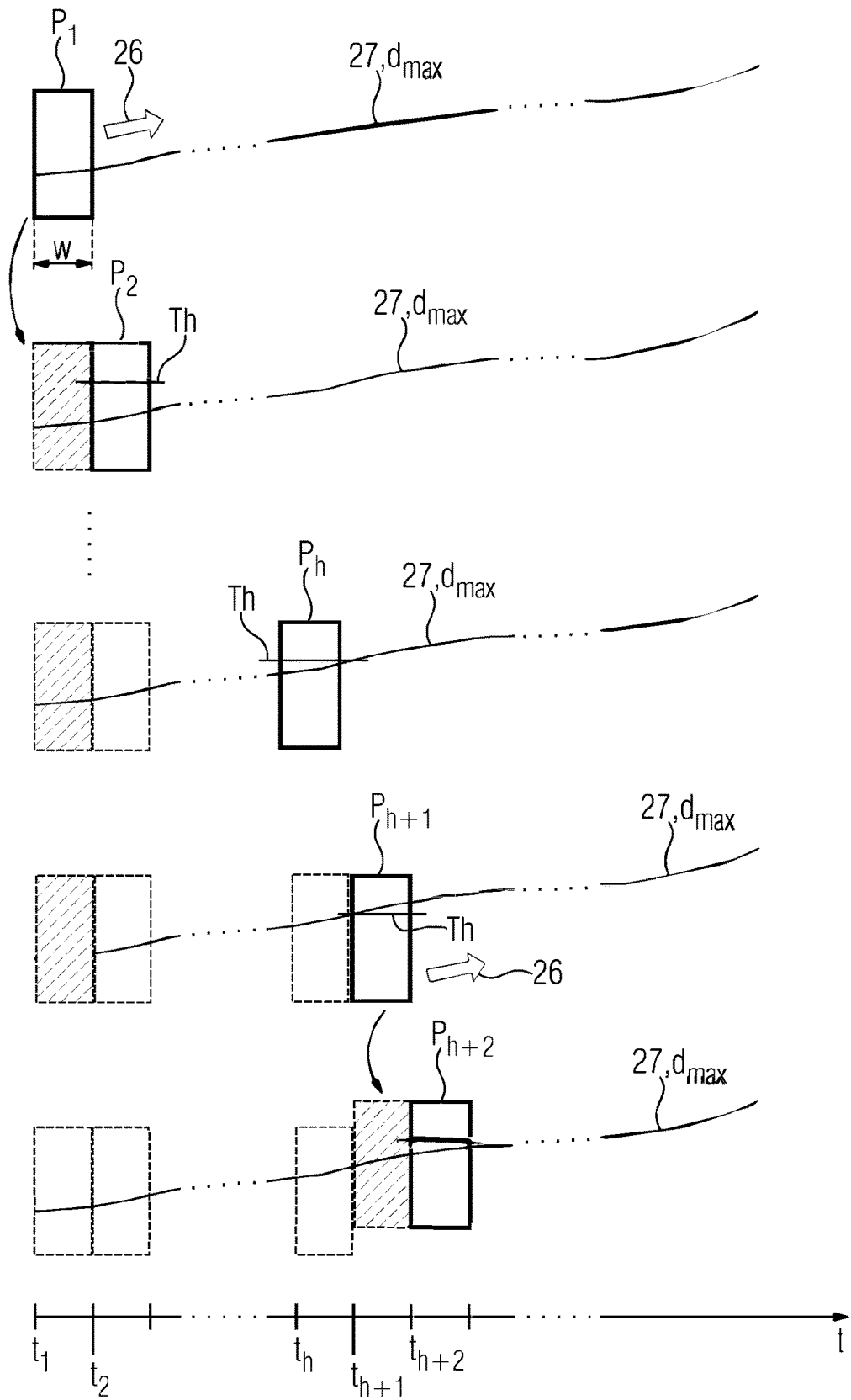
FIG. 3 is an exemplary graphical plot of a timing diagram illustrating generating and selecting of data packages for transmission and storage in accordance with the invention.

FIG. 3 exemplarily shows a sequence of data packages $P_i$, $P_2$, $P_h$, $P_{h+i}$, $P_{h+2}$ that are generated from the data stream 10 at the times $t_1, t_2, t_h, t_{h+1}, t_{h+2}$. Each data package P covers a time windows w of the same size, in which the data stream 10 is sampled in a pre-selected number of time intervals. The current (new) data packages are marked by solid lines and the earlier (older) ones by dotted lines. The first data package contains new information and is therefore transmitted to the storage 11, which is indicated by an arrow 26.

A curve designated by reference number 27 depicts data changes of the data 10 sampled over the time t. As explained above, this change is detected for each new data package, e.g., $P_2$, by projecting its data points onto a set of principal components, aligning for each principal component, via dynamic time warping, the projected data points to respective projected data points of an earlier generated data package, e.g., $P_1$, and calculating distances between the aligned projected data points of the two data packages Pi, P2. The maximum $d_{max}$ of the calculated distances is a measure of the data change and is compared to the threshold value Th. The new data package $P_1$ is only transmitted to the storage 11 if the maximum distance $d_{max}$ exceeds the threshold value Th, which is not the case for the data package $P_2$. The earlier data package $P_1$ is therefore retained as a reference for the comparison with the next new data package $P_3$, which function of a reference is here indicated by hatching of the data package $P_1$.

The data package $P_{h+1}$ is the first one where the calculated maximum distance $d_{max}$ exceeds the threshold value Th. As a result, the data package $P_{h+1}$ is transmitted to the data storage 11 and the data package $P_{h+1}$ replaces the earlier data package $P_{h+1}$ as the reference used for next comparisons.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A computer-implemented method for data transmission with a reduced data volume, comprising:
   receiving a multivariate data stream including a plurality of data points;
   sampling the multivariate data stream in consecutive time intervals and generating consecutive data packages which each contain data points sampled in a window of a pre-determined number of said consecutive sampling time intervals;
   calculating, via principal component analysis, for each data package projections of its data points onto a set of principal components;
   aligning, via dynamic time warping, for each newly generated data package and for each principal component the projected data points to respective projected data points of an earlier generated data package and calculating distances between aligned data points;
   determining a maximum of the calculated distances and comparing said determined maximum distance to a threshold value; and
   transmitting the newly generated data package to a data sink and setting the newly generated data package to be the earlier generated data package for the next aligning step if the maximum distance exceeds the threshold value or otherwise inhibiting the transmission and retaining the earlier generated data package for the next aligning step.

2. The computer-implemented method of claim 1, wherein the set of principal components is selected to consist of a predetermined number of the eigenvectors with the largest eigenvalues.

3. The computer-implemented method of claim 2, wherein the predetermined number of the eigenvectors is between 20 and 50.

4. The computer-implemented method of claim 1, wherein the maximum of the calculated distances is determined to be one of (i) the largest one of individual maximum distances calculated for each principal component and (ii) as cumulative value of these individual maximum distances.

5. The computer-implemented method of claim 4, wherein the maximum of the calculated distances is determined from squares of distances between the aligned data points.

6. The computer-implemented method of claim 1, wherein the threshold value is calculated from an average of the maximums determined for a predetermined number of the most recently data packages.

7. A computing device for data transmission with a reduced data volume, comprising:
- a receiving unit configured receive a multivariate data stream including a plurality of data points from a data source;
- a sampling unit configured to sample the data stream in consecutive time intervals and to generate consecutive data packages which each contain data points sampled in a window of a predetermined number of the consecutive sampling time intervals;
- a calculating unit configured to:
  - calculate, via principal component analysis, for each data package, projections of its data points onto a set of principal components, and
  - align, via dynamic time warping, for each newly generated data package and for each principal component the projected data points to respective projected data points of an earlier generated data package and calculate distances between the aligned data points;
- a judging unit configured to determine a maximum of the calculated distances, compare said maximum to a threshold value and to set the newly generated data package as the earlier generated data package for the next aligning step if the maximum distance exceeds the threshold value or otherwise retain the earlier generated data package for the next aligning step; and
- a transmitting unit controlled by said judging unit and configured to transmit the newly generated data package to a data sink only if the maximum distance exceeds the threshold value or otherwise inhibit the transmission.

8. A program product comprising code for directing a computing device to perform the method of claim 1.

* * * * *